United States Patent
Levitsky

(10) Patent No.: US 9,642,251 B2
(45) Date of Patent: May 2, 2017

(54) TRANSPARENT CONDUCTIVE COATING BASED ON PERCOLATIVE GRID

(71) Applicant: Igor A Levitsky, Fall River, MA (US)

(72) Inventor: Igor A Levitsky, Fall River, MA (US)

(73) Assignee: Igor Levitsky, Fall River, MA (US)

( * ) Notice: Subject to any disclaimer, the term of this patent is extended or adjusted under 35 U.S.C. 154(b) by 227 days.

(21) Appl. No.: 14/567,929

(22) Filed: Dec. 11, 2014

(65) Prior Publication Data

US 2016/0174368 A1    Jun. 16, 2016

(51) Int. Cl.
| | | |
|---|---|---|
| *H01B 1/00* | (2006.01) | |
| *H05K 1/09* | (2006.01) | |
| *G06F 3/041* | (2006.01) | |

(52) U.S. Cl.
CPC ............. *H05K 1/09* (2013.01); *G06F 3/041* (2013.01); *G06F 2203/04103* (2013.01); *G06F 2203/04112* (2013.01); *H05K 2201/0108* (2013.01); *H05K 2201/09681* (2013.01)

(58) Field of Classification Search
CPC .. B82Y 10/00; B82Y 30/00; H01L 31/022466
USPC ............................. 252/500; 136/256; 349/139
See application file for complete search history.

(56) References Cited

U.S. PATENT DOCUMENTS 4,586,988 A * 5/1986 Nath ................ H01L 31/02246
136/256

* cited by examiner

*Primary Examiner* — Khanh Tuan Nguyen

(57) ABSTRACT

Disclosed is a new class of transparent conductive coatings based on conductive grids and percolative pattern therefore.

7 Claims, 4 Drawing Sheets

TRANSPARENT CONDUCTIVE COATING BASED ON PERCOLATIVE GRID

CROSS REFERENCE TO RELATED APPLICATION

This application claims the benefit of pending U.S. Provisional Application No. 61/928,653 filed on Jan. 17, 2014 entitled "Transparent Conductive Coating Based on Percalation Grid", the entire subject matter of which is incorporated herein by reference.

FIELD OF THE INVENTION

The present invention relates to a novel class of transparent conductive coatings (TCCs) based on conductive grids. This invention discloses an implementation of percolative pattern, which allows improving transmittance/sheet resistance (T/R) performance as compared with periodical and non-periodical conductive grids.

BACKGROUND OF THE INVENTION

The diversification in transparent conductive coating materials takes its source from the several issues related to indium tin oxide (ITO): limited indium supply on earth, high cost of the thin film deposition process, failing performances for applications demanding low surface resistivity, film flexibility and high transmission as well as toxicity of material. Thus, the critical trend in the current market of TCC is alternative technologies to ITO, which include carbon nanotubes, graphene, metal nanowires, other transparent oxides, conductive polymers, and conductive grids.

Some ITO-alternative technologies, like carbon nanotubes, graphene and conductive polymers can not provide sufficiently low sheet resistance or are too expensive to be considered for high volume production. Metal nanowires and nanoparticles have inherent problems with haze and transmission for materials with sheet resistance below <30 Ohm/sq.

The only viable alternative to ITO (and the only solution for large touch screen displays) is a conductive grid. Conductive grid (mostly made from metals, but other conductors are possible) has the capability to provide very low resistivity, approaching pure metal values, and at the same time keep optical transmission high, comparable with uncoated glass or polymer substrates. High transmission is an essential requirement for modern touch display devices. Also, since metal grid is fabricated by printing/patterning, this process can be integrated with trace patterning, which currently is responsible for more than 50% of touch screen production cost. The current grid based TCCs are prepared by deposition of the regular (periodical) grid of conductive bonds and could provide transmittance up to 90% at sheer resistance of 5-10 Ohm/sq.

It would therefore be desirable to have novel grid based transparent conductors with improved T/R performance as compared with TCCs made from regular conductive grids.

SUMMARY OF THE INVENTION

The present invention provides an approach for the fabrication of a new class of TCCs based on percolative pattern applied to conductive grids.

This invention describes an approach that can significantly improve T/R performance at the low resistance range (1-100 Ohm/sq) which is highly demanded for displays, solars, and LEDs industries. As distinct from the regular conductive grid (FIG. 1) used for fabrication of TCC, percolative grid (FIG. 2) provides higher transparency at the almost same sheet resistance.

It is important that this invention discloses an approach, where percolative pattern is formed mostly at micro-scale by highly conductive bonds and cannot be considered as a method for fabrication of continuous TCC. Thus, a disclosed novel class of transparent conductors is related to the grid based TCCs and should not be confused with continuous TCCs existing due to percolation conductivity at nano-scale for various conductive networks (metal nanowires, carbon nanotubes(CNTs), nanoparticles).The continuous TCCs based on nano-scale percolation are well known and disclosed in patents (U.S. Pat. No. 8,018,563 (Jones et al.); U.S. Pat. No. 8,094,247 (Allemand et al.); U.S. Pat. No. 7,780,876 (Nakatani)) and scientific literature (Hecth et al., Adv. Mater. 23:1482, 2011; Layani et al., Nanoscale 6: 55, 2014). For example, CNT or metal nanowire networks (continuous TCC) at percolation threshold provide a high sheet resistance R~10 KOhm/sq, while percolative pattern disclosed in this invention is capable of reaching a resistance of 2-5 Ohm /sq or less.

In this invention, the conductive material forming grid can be any conductor possessing partial transparency (e.g, conductive polymers such as PEDOT, carbon nanotubes, graphene, conductive metal oxides) or completely reflective (e.g. metals or metal nanowires).

More particularly there is provided the gain of T/R performance at percolation threshold, where R decreases sharply as a non-linear function, while the T reduction is linear as proportional to the number of conductive bonds (FIG. 3).

In accordance with other aspects of the present invention, the transparency T can be further increased after the removal of the "dead" bonds, which do not contribute to the conductivity but reduce the pattern transparency (FIG. 4).

Also, in accordance with the present invention there is provided suppressed light diffraction due to a random pattern, which is a serious drawback for the regular grid (e.g. the Moiré effect caused by interference of regular grid pattern with display microstructure).

Additionally, in accordance with the present invention there is provided the capability to apply a pattern in microscale without expensive nano-patterning. A nanolithography can be employed to fabricate regular TCC with a characteristic size less than light wavelength, which allows avoiding light diffraction. Meanwhile percolative pattern provides similar non-diffractive light propagation using cost effective deposition method (e.g. printing) with a characteristic size of several microns.

Also, in accordance with the present invention there is provided a reduced fabrication cost as compared with regular grid due to lower consumption of conductive materials. The cost of percolative pattern can be lower by up to 30-50% than the cost of a regular square grid.

Additionally, in accordance with the present invention there is provided an universality in terms of conductive materials and deposition methods (printing, spraying, coating) for various substrates (rigid and flexible polymeric films).

DETAILED DESCRIPTION

In accordance with presented invention, the major body of patent specification describes percolative pattern formed by the bonds made from partially transparent conductive materials (CNTs, grapheme, metal oxides), however it can be extended to completely reflective materials with metallic conductivity.

The detailed description of this invention provides theoretical and experimental proof that the use of percolative pattern allowing to achieve a gain of T/R performance in the low resistance range (1-100 Ohm/sq) as compared with regular conductive grid and continuous TCC.

Figure 1:
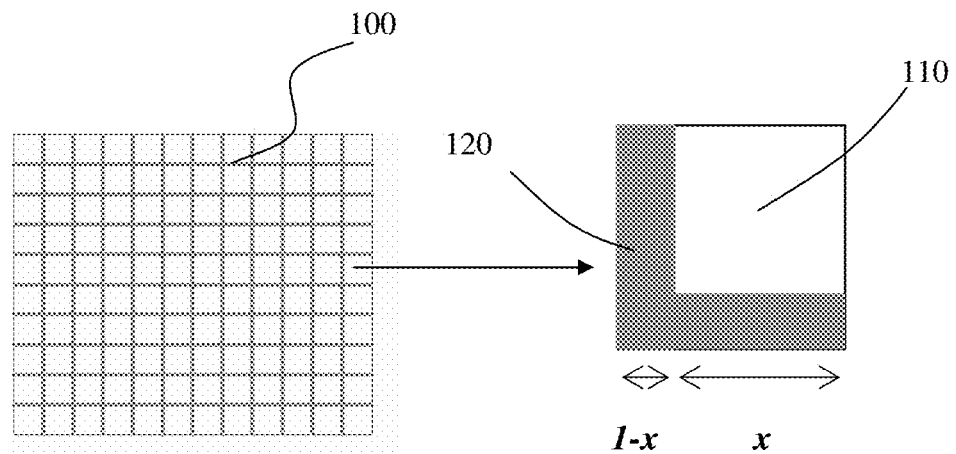
FIG. 1. Schematic of a two-dimensional regular square grid (100)—left; and its unit cell with transparent area of $x^2$ (110) and reflective or partially transparent area of $1-x^2$ (120)—right.

In one preferred embodiment let us consider, the dependence of light transmittance (T) on sheet resistance (R) for a thin continuous coating (thin uniform film) on a transparent substrate, where the transmittance in visible and NIR ranges is the result of a light absorbance. Then T(R) is given:

$$T = I/I_0 = \exp(-kd) = \exp(-A/R) \quad (1)$$

with A=kp, where k is the absorbance coefficient, p is the SWNT resistivity, and R is the sheet resistance of the SWNT film. The transmittance of a conductive n×n square grid (FIG. 1) can be expressed through its sheet resistance, R, and length parameter x (0<x<1, FIG. 1) as:

$$T = (1-x^2)e^{-\frac{A}{R(1-x)}} + x^2 \quad (2)$$

taking into account that T and R of the square n×n grid are equivalent to these of a unit cell (FIG. 1)

Figure 2:
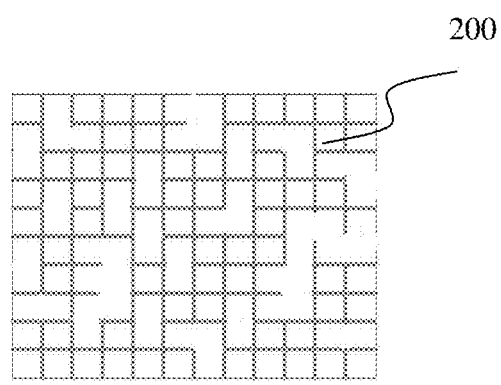
FIG. 2. Schematic of a two-dimensional percolative square grid (200).
Figure 3:
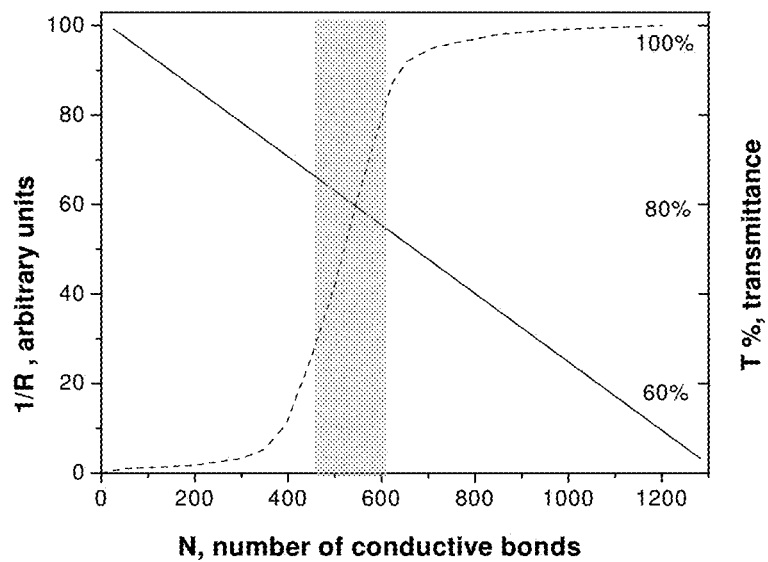
FIG. 3. Inversed sheet resistance ($R^{-1}$—dashed curve) normalized on inversed sheet resistance of regular square grid and transmittance (T %—solid line) as a function of conductive bonds (N) for percolative square grid (35×35) with x=0.7; the maximum of conductive bonds (1225=35× 35) corresponds with a regular square grid; shadow area shows the percolation region.

In another embodiment for the case of percolative square grid (FIG. 2) with bond percolation, the total transmittance can be presented as the sum of transmittance of the number of conductive unit cells, $N_C$, and the number of empty unit cells, $N_E$, where two conductive bonds are removed. In terms of transparency two conductive unit cells with one bond removed are equivalent to one empty unit cell. Then, with $N=n \times n=N_C+N_E$, the transmittance of the percolative grid is expressed as:

$$T_F = \frac{I_0 \sum_1^{N_c}(1-x^2)e^{-kd} + I_0\sum_1^{N_c} x^2 + I_0 N_E}{I_0 N} = \alpha[(1-x^2)e^{-kd} + x^2] + 1 - \alpha \quad (3)$$

where $$\alpha = \frac{N_C}{N},$$

(0<$\alpha$<1) is the fraction of conductive cells. The resistance of a two-dimensional square percolative grid with a bond percolation is characterized by percolation threshold, 0.5, and universal critical exponent, 1.33 via the expression:

$$\frac{1}{R_N^F} = \left(\frac{2.5}{R_N}\right)(\beta - P_T)^n = \left(\frac{2.5}{R_N}\right)(\beta - 0.5)^{1.33} \quad (4)$$

where $\beta$ is the fraction of the conducting bonds. The value 2.5 is taken so that $R^F_N = R_N$ at $\beta$=1 (regular square grid). For an n×n grid $\beta$ can be expressed as $\beta = p_C/p_N$, where $p_N$=2n(n-1)~$2n^2$=2N is the total number of bonds, and $p_C$ is the number of conductive bonds. As two removed bonds generate one empty cell, the fraction of conductive bonds should be the same as the fraction of conductive cells ($\beta = \alpha$). Using the layer thickness, $$d = \frac{\rho}{R_N(1-x)}$$

and eq. (4), d can be expressed in terms of $R_F$ as:

$$d = \frac{0.4\rho(\beta - 0.5)^{-1.33}}{R_N^F(1-x)} \quad (5)$$

Substitution of eq. (5) into eq. (3) finally gives:

$$T_F = \alpha\left[(1-x^2)e^{-\frac{0.4A(\alpha-0.5)^{-1.33}}{R_N^F(1-x)}} + x^2\right] + 1 - \alpha \quad (6)$$

Eq. (6) is reduced to eq. (2) in the case when $\alpha$=1, as $R^F_N = R_N$, corresponding to the regular square grid.

Figure 5:
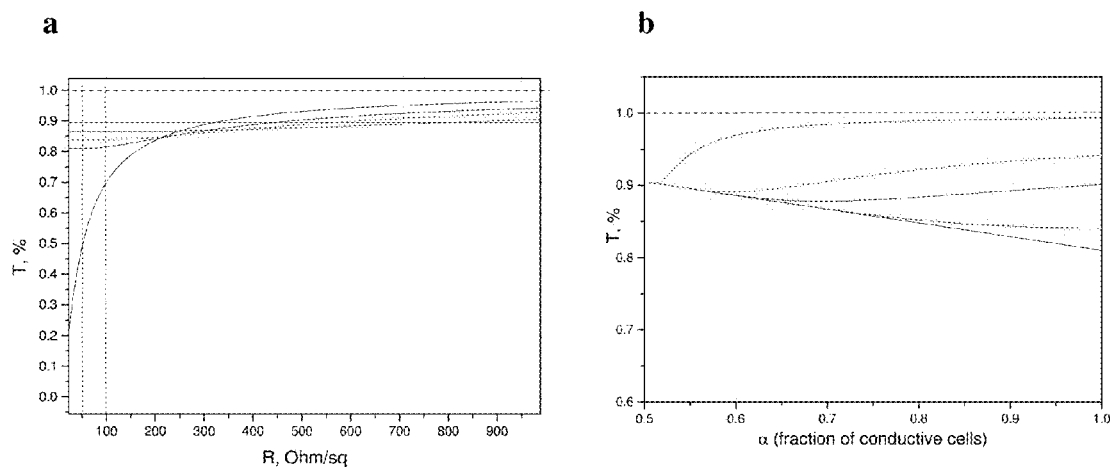
FIG. 5. (a) T(R) curves for uniform (black, eq. (1)); regular square grid (blue, eq. (2)) and percolative square grids (eq. (6)): green ($\alpha$=0.85), magenta ($\alpha$=0.70), and red ($\alpha$=0.55); (b) T($\alpha$) curves (eq. (6)) for R=10 Ohm/sq (black), 200 Ohm/sq (red), 500 Ohm/sq (blue), 1000 Ohm/sq (green), 10000 Ohm/sq (magenta). For all curves A=35.6 $Ohm^{-1}$ and x=0.9.

FIG. 5a shows the calculated T(R) dependencies for uniform, regular square and percolative square grids for different values of parameter $\alpha$. As parameter $\alpha$ approaches 0.5 (percolation threshold value), the transmittance of the coating becomes constant, regardless of sheet resistance in the range of 0-100 Ohm/sq (red, magenta in FIG. 5a). The transmittance of a coating near the percolation threshold exceeds that of regular square grid for R<200 Ohm/sq (blue color, FIG. 5a) and is significantly higher than the transparency of uniform coating (black color, FIG. 5a).

FIG. 5b shows how the T value depends on the fraction of conductive cells (α) for different sheet resistance values. For low R~10-200 Ohm/sq, the α decrease results in a transmittance improvement of almost 10% near the percolation threshold when compared with a regular grid. On the contrary, for highly resistive films (FIG. 5b, magenta) approaching the percolation threshold leads to a reduction of transmittance. In this case an increase of the film thickness (and consequently absorbance) dominates over the growth of open space in the percolative grid.

Figure 6:
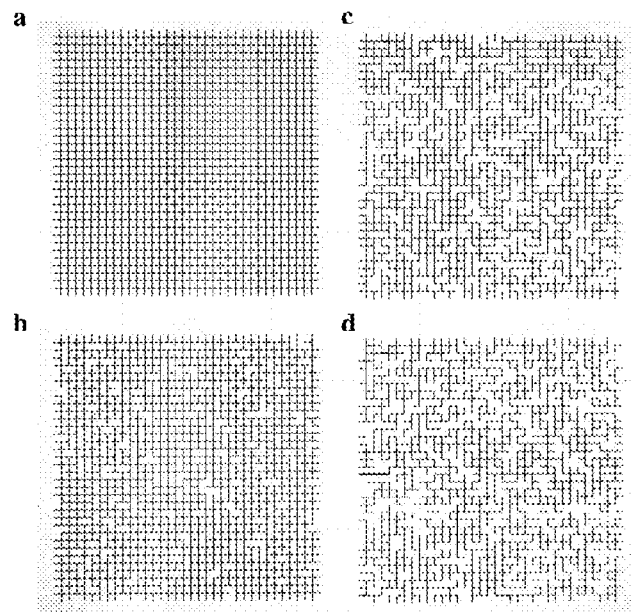
FIG. 6. Photo image of regular (a) and percolative patterns with 90% (b), 70%(c) and 63%(d) remaining conductive bonds. Grid size is 35×35 mm with unit cell of 1×1 mm and x=0.9 mm. Substrate is PET.

In another embodiment experimental data are presented which confirms the modeling results. For this purpose a dispersion of carbon nanotubes (CNTs) was uniformly sprayed on the PET substrate with varied sheet resistance. Then, continuous CNT films were ablated in accordance with the generated patterns (regular and percolative) using a computer controlled rastering excimer laser. Percolative patterns were prepared by removing random bonds according to a random number generation in the square (35×35) regular grid. Photographs of the resulting patterned CNT films (one regular and three percolative) are shown in FIG. 6. Sheet resistance was measured between two silver paint electrodes deposited at sample boundaries and transmittance was recorded at 550 nm.

Figure 4:
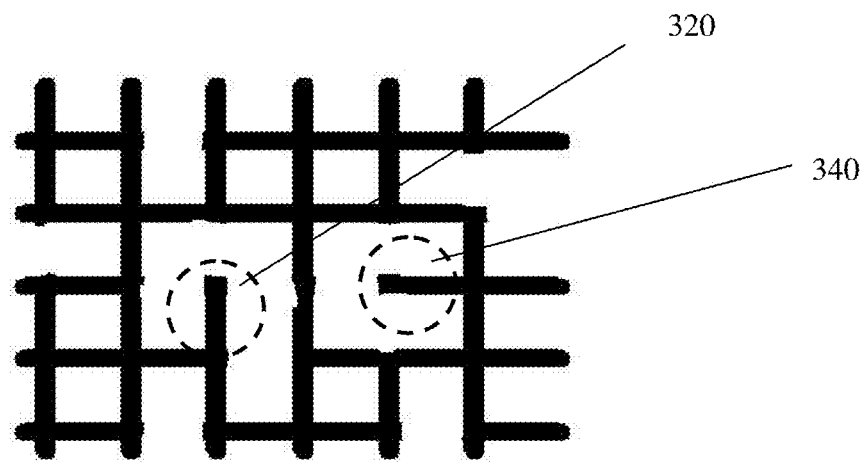
FIG. 4. Fragment of percolative square grids with two "dead" bonds (320, 340) not contributing to conductivity.
Figure 7:
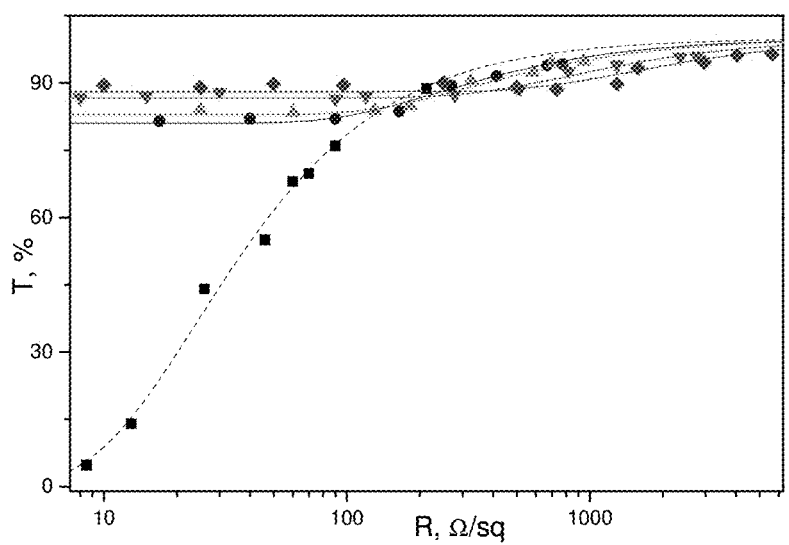
FIG. 7. Experimental data (black dots) for uniform coating fit by eq. (1) (black dotted curve) with A=24.3 $Ohm^{-1}$. Calculated T(R) curves (A=24.3 $Ohm^{-1}$, x=0.9) and corresponding experimental data (dots of the same color) for regular square grid (blue) and percolative square grids: green ($\alpha$=0.90), magenta ($\alpha$=0.70), and red ($\alpha$=0.63).

Initially, experimental R(T) data for uniformly coated samples (continuous CNT films) was fitted by eq. (1) to obtain the value of parameter A (FIG. 7, black squares—experiment, black dot line—fit). Then the A value was used for calculation of R(T) for regular square and percolative grids. Transmittance of regular square and percolative samples was corrected for residual material due to incomplete ablation of CNT film. FIG. 7 shows an excellent agreement between experimental data and the theoretical model. The calculations according to eqs (2) and (6) are in excellent agreement with experiment (FIG. 7), which demonstrates that T/R performance of percolative grid near the percolation threshold can be significantly improved as compared with a regular grid (blue color, FIG. 7) and continuous coating (black color, FIG. 7) for low resistance films (less than 100 Ohm/sq). For example, with a percolation pattern, it is possible to reach almost 90% transparencies at 1 OHM/sq (red, magenta colors FIG. 7) which exceeds any existing uniform transparent conductive coating. An increase of the x value and approaching α to the percolation threshold (0.5 in the case of regular lattice) it is possible to reach 95-98% transparency at 1-10 Ohm/sq. The above approach can be generalized for completely refractive conductors (metals, metal nanowires) and any kind of two-dimensional percolative pattern, such as the Sierpinski gasket or a random fractal, for bond and site percolation. The R/T performance for the percolative pattern can be further improved by removal of "dead" bonds (FIG. 4), which do not contribute to conductivity but reduce the coating transmittance.

All of the above U.S. patents, U.S. patent applications, and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of fabricating a transparent conductive coating by random removal of conductive bonds from two-dimensional periodical grid and comprising of a percolative pattern wherein number of conductive bonds in the pattern determines grid conductivity at a percolation threshold or above percolation threshold, wherein the percolative pattern provides a gain of figure of merit as a ratio of transmittance to sheet resistance, where the sheet resistance decreases sharply as a non-linear function, while the transmittance reduction is linear as proportional to the number of conductive bonds.

2. The method of claim 1, wherein the percolative pattern is formed by additional removal of conductive bonds which do not contribute in coating's conductivity.

3. The method of claim 1, wherein percolative pattern is formed by random removal of conductive bonds from two-dimensional non-periodical grid having conductivity of 50% higher than the conductivity at the percolation threshold.

4. The method of claim 3, wherein the percolative pattern is formed by additional removal of conductive bonds which do not contribute in coating's conductivity.

5. The method of claim 1, wherein conductive bonds are formed from completely reflective conductive materials or conductive materials with partial transmittance.

6. The method of claim 1, wherein percolative pattern is prepared by deposition of conductive materials by printing, coating, spin-coating, lithography, stamping, molding, chemical vapor deposition, laser ablation, sputtering or evaporation.

7. The method of claim 1, wherein percolative pattern is deposited on a transparent rigid substrate or a transparent flexible substrate.

* * * * *